United States Patent

Mould et al.

[11] Patent Number: 5,807,606
[45] Date of Patent: Sep. 15, 1998

[54] APPLYING ADHESIVE TO SUBSTRATES

[75] Inventors: Douglas K. Mould, W. Upton; Joseph Renda, Jr., West Quincy; Steven W. Hall, Douglas, all of Mass.

[73] Assignee: MPM Corporation, Franklin, Mass.

[21] Appl. No.: 904,007

[22] Filed: Jul. 31, 1997

Related U.S. Application Data

[63] Continuation of Ser. No. 519,118, Aug. 24, 1995, abandoned.

[51] Int. Cl.⁶ ......................................................... B05D 1/36
[52] U.S. Cl. ............................ 427/10; 118/406; 118/428; 118/500; 118/665; 118/688; 427/96; 427/207.1; 427/282; 427/430.1
[58] Field of Search .......................... 427/10, 96, 207.1, 427/282, 430.1; 118/665, 688, 406, 428, 500

[56] References Cited

PUBLICATIONS

MPM Brochure for Automated Stencil Printers for Fine Pitch SMI Assembly, AP Series, 1993 (no month avail.).

*Primary Examiner*—Bernard Pianalto
*Attorney, Agent, or Firm*—Mintz, Levin, Cohn, Ferris Glovsky and Popeo, P.C.

[57] ABSTRACT

Applying adhesive in a desired pattern on a substrate by determining one or more inspection sites for monitoring adhesive deposition, applying adhesive to a substrate with a stencil or screen printer, viewing the inspection sites with a camera that generates image signals, and processing the image signals to determine if adhesive has been properly applied at the inspection sites.

27 Claims, 2 Drawing Sheets

APPLYING ADHESIVE TO SUBSTRATES

This application is a continuation application Ser. No. 08/519,118, filed Aug. 24, 1995, abandoned.

BACKGROUND OF THE INVENTION

The invention relates to applying adhesives to substrates, e.g., printed circuit boards.

Adhesive is generally applied to the desired areas of a printed circuit board for adhering components to the circuit board using a syringe-type dispenser moved over the board. Some dispenser type systems have employed cameras to verify that the adhesive has been properly applied.

It is also known to print adhesive through a stencil or screen onto a board in a desired pattern using the same equipment that is used for printing solder on conductive pads on the board. The stencil/screen printers have employed cameras used to verify that solder has been properly applied, but adhesive applied with the stencil/screen printers has been checked manually. Also, while the use of stencil/screen printers to apply adhesive has many advantages over the use of dispenser type systems (such as speed, cost, floor space, use of thicker adhesive), dispenser type systems have been predominantly used to apply adhesive.

SUMMARY OF THE INVENTION

The invention features, in general, reliably and quickly applying adhesive in a desired pattern on a substrate by determining one or more inspection sites for monitoring adhesive deposition, applying adhesive to a substrate with a stencil or screen printer, viewing an inspection site with a camera that generates image signals, and processing the image signals to determine if adhesive has been properly applied at the inspection site.

In preferred embodiments the camera is used to view an initial substrate on which adhesive has been applied in the desired pattern, and a user defines inspection sites on a monitor that displays an image of at least a portion of the substrate. Adhesive objects are identified by coordinate positions and respective areas. A controller that processes the image signals can determine whether all objects identified during in an inspection site on the initial substrate are present in the viewed adhesive objects, whether the viewed objects include any objects that were not identified on the initial substrate, and whether other constraints (e.g., % area, height) have been met. If constraints are not met, the controller can activate an alarm or a board diverter to divert a board from further processing. The controller can also adjust process control parameters (e.g., squeegee velocity, squeegee pressure, snap-off, or downstop) in response to the processing of image signals. Thus, in addition to improving reliability by viewing the deposited adhesive, the adhesive deposition accuracy can be improved by making appropriate adjustments to process control.

Other advantages and features of the invention will be apparent from the following description of the preferred embodiment thereof and from the claims.

DESCRIPTION OF THE PREFERRED EMBODIMENTS

Figure 1:
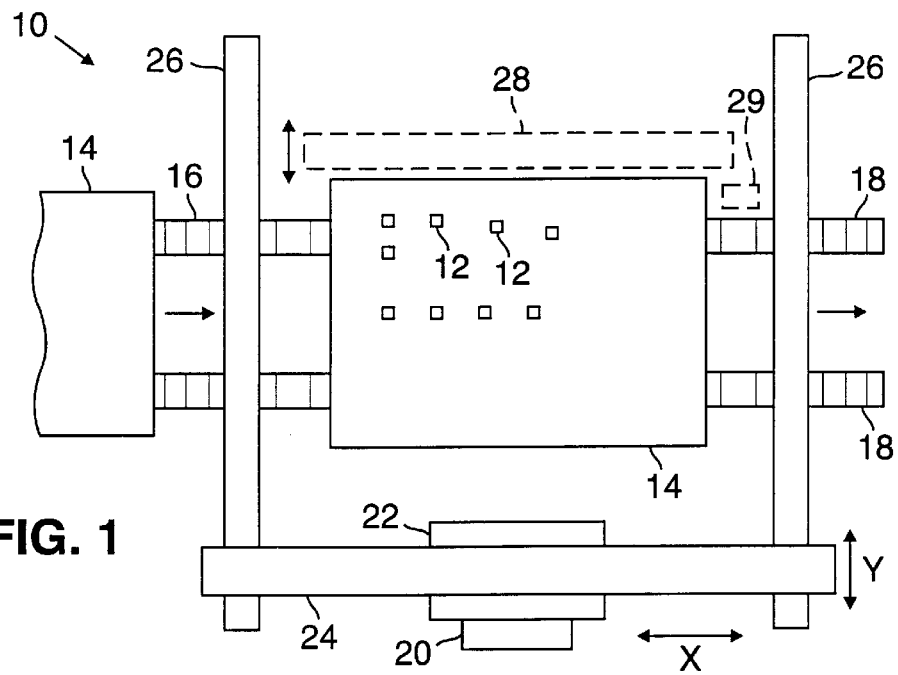
FIG. 1 is a partial, diagrammatic plan view of an adhesive printer according to the invention.

Referring to FIG. 1, there are shown some of the components of printer 10 used to apply adhesive deposits 12 in a desired pattern on circuit boards 14. The printer is an improvement of the type of printer described in Freeman U.S. Reissue Pat. No. 34,615 and commercially available under the Ultraprint 2000 trade designation from MPM Corporation, Franklin, Mass., both of which are hereby incorporated by reference. The printer can also be used to print solder, and can employ a screen or a stencil; the use of a stencil is described herein.

As is shown in FIG. 1, printer 10 includes tractor feed mechanism 16 to supply the boards 14 to a central area where the boards are supported from below (by components not shown). Tractor mechanism 18 is used to remove processed boards. The printer also includes camera 20 carried on carriage 22, which is movable in an X direction along frame 24, which is a linear X-axis of motion. Frame 24 in turn is movable in a Y direction along tracks 26, which is a linear Y-axis of motion. Printer 10 also includes squeegee/adhesive applicator 28 and laser 29, both positioned above board 14 and shown in phantom in FIG. 1. The adhesive applicator can vary the amount of adhesive delivered across the squeegee. The laser (or other focussed beam) can be directed to the board surface at an angle and used to determine adhesive height.

Figure 2:
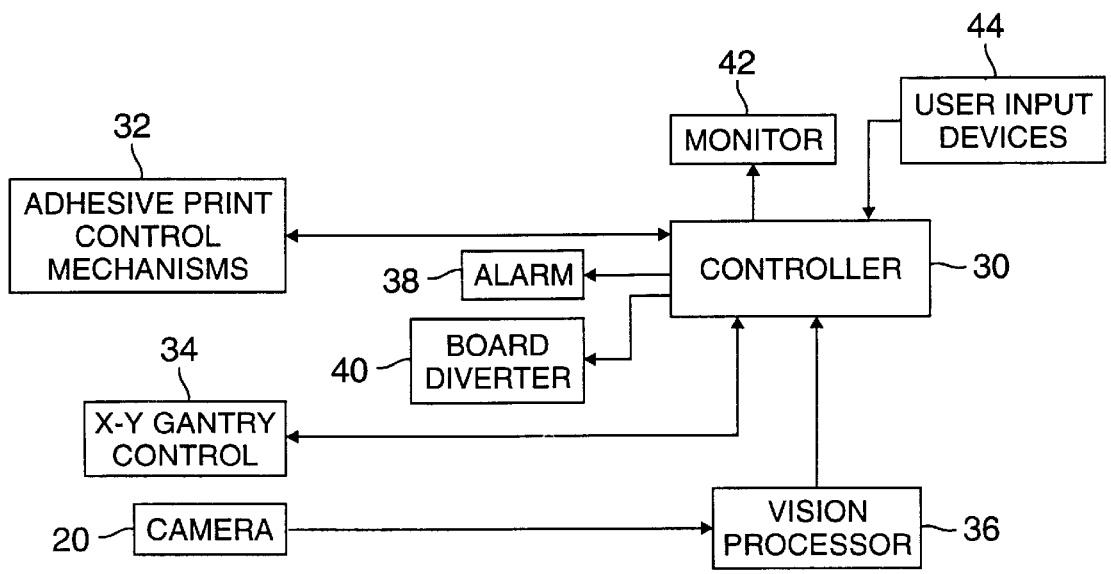
FIG. 2 is a block diagram showing the control components for the FIG. 1 adhesive printer.

Referring to FIG. 2, controller 30 of printer 10 receives inputs from and provides control signals to a wide variety of adhesive print control mechanisms collectively designated 32 on FIG. 2. These include the tractor mechanisms 16, 18 and squeegee/adhesive applicator 28 shown on FIG. 1 and other sensors and actuators not shown on FIG. 1. Controller 30 also controls X-Y gantry control 34 (including frame 24 and tracks 26), and receives modified image signals from vision processor 36 (available under the Cognex 5000 trade designation from Cognex Corporation), which in turn controls and receives image signals from camera 20. Controller 30 also provides alarm signals to alarm 38 and diverter signals to board diverter 40 (located down line of tractor mechanism 18) when a processed board 14 fails to meet user specified standards for printing adhesive. Monitor 42 and user input devices 44 (e.g., a key board and mouse) are used to provide an interface to the user to display and report operation and to define control parameters.

Before beginning a production run in which identical patterns of adhesive are printed on a plurality of boards, the user defines inspection sites to be viewed for adhesive deposits, and the controller 30 establishes parameters for identifying that the adhesive deposits are present on the boards in the run. This is done by loading a board 14 that has adhesive properly printed on it at all desired locations and viewing it with camera 20. Camera 20 is moved by the user, using a cursor on monitor 42 to scan a desired position on the board, and monitor 42 displays the surface of board 14 viewed by camera 20. The user is presented with a menu permitting him to specify whether there will be a single adhesive deposit in an inspection site, two adhesive deposits in an inspection site, or multiple adhesive deposits in an inspection site. The adhesive deposits within an inspection site might all be used for a single component on the board, e.g., one deposit for a small component, two for a small elongated component, and a multiplicity for a larger component. The user specifies an inspection site by bringing the desired area into view on monitor 42, and then drawing the boundaries 46, 48, or 50 for the inspection site (e.g., up to 0.3" by 0.3" in board area) on monitor 42 using input devices 44, as appears in the portion of the display of monitor 42 shown in FIG. 3. Vision processor 36 includes circuits and logic to distinguish viewed adhesive objects 52 from the board background 54 and conductive pads 56 in its field of view. In particular bandpass filtering is used in vision processor 36 to assist in filtering out the board background and the conductive pads. Vision processor 36 is programmed to identify adhesive objects in its field of view by the X, Y coordinates of the object's center of mass and the object's area, and these values are reported to controller 30. Because the field of view will typically be larger than an inspection site, controller 30 ignores the values for objects outside of the boundaries for the inspection site presently under consideration.

Figure 3:
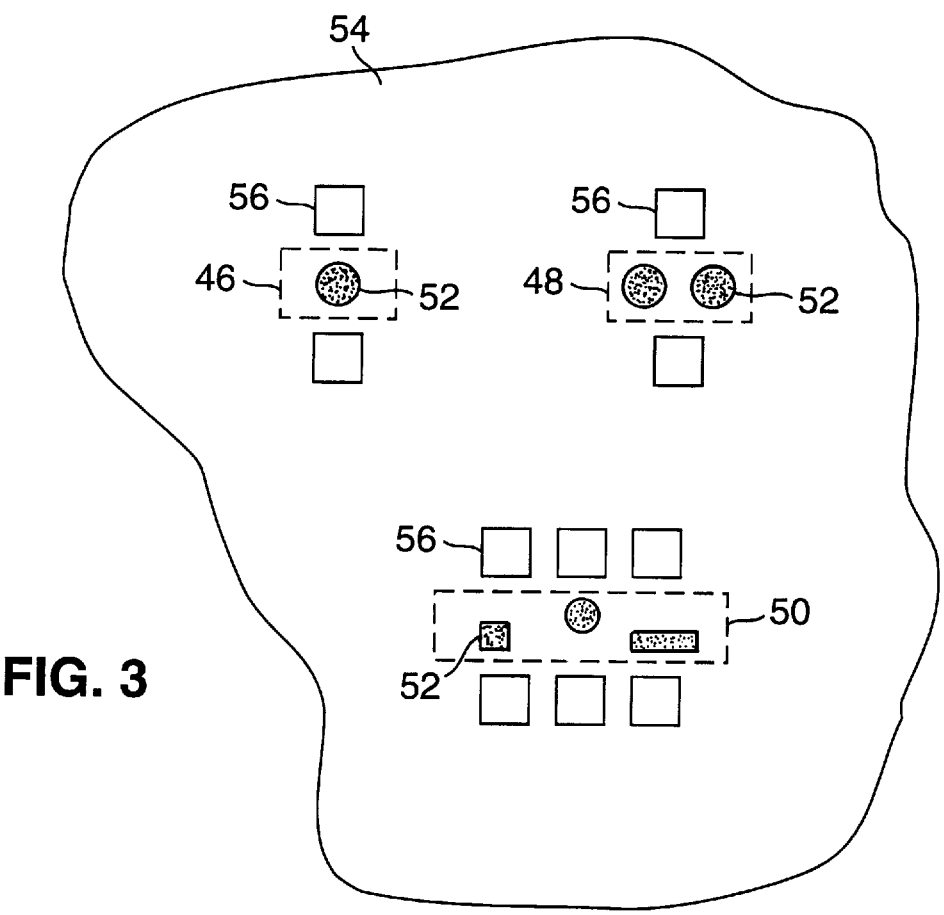
FIG. 3 shows a portion of a display of the surface of a substrate on a monitor of the FIG. 1 apparatus.

The user does this for all desired inspection sites. FIG. 3 shows inspection sites having one (within boundary 46), two (within boundary 48), and three (within boundary 50) viewed adhesive objects 52. As appears from FIG. 3, the adhesive objects 52 can have different shapes and sizes and can be arranged in any pattern. The inspection sites can similarly have any user specified shape and size so long as the maximum area constraint mentioned above is met.

The user then is prompted to specify the conditions for vision controlled verification of adhesive deposits, including:

the frequency of selecting a board for verification, whether every board, every other board, or randomly selected boards, whether all inspection sites or randomly selected or specified inspection sites are to be viewed on the boards selected for viewing (e.g., inspection sites at problem or critical areas might be viewed more frequently), and whether an alarm should be made or a board should be automatically diverted or allowed to continue with further processing. The user also specifies the rejection condition, e.g., reject if the area of the viewed adhesive object is less than 80% or greater than 110% of the measured area for that object, and reject if additional objects are identified in the inspection site (e.g., present in board background 54).

During a production run, boards 14 are automatically moved into position by tractor feed mechanism 16, engaged by underboard support components (not shown) and raised into position directly under a stencil (not shown) with openings corresponding to the position for adhesive deposits 12. Squeegee/adhesive applicator 28 then moves across the upper surface of the stencil pushing adhesive in front of it on the stencil surface, and adhesive is forced through the openings into contact with the surface of board 14. It is desired to have adhesive deposits completely occupy all areas aligned with the stencil openings. Process control parameters that affect the ability to meet this goal include squeegee velocity, downward pressure on the squeegee, "snap-off" (the distance of the board below the stencil, which may tend to lift off of the board as the squeegee travels over it), and "downstop" (the distance under the stencil to which the squeegee would move if not prevented from doing so by the stencil).

Board 14 is then lowered, and camera 20 is moved over the board to view the inspection sites for this board, assuming that it is a board selected for verification under the criteria input by the user. Camera 20 sends image signals of its field of view to vision processor 36, which then identifies all adhesive objects 52 within the field by coordinates for the center of mass and the object area, and these values are supplied to controller 30. Controller 30 only considers the objects with coordinates within the relevant inspection site, and compares the areas with the areas that had been determined for the initial design board, e.g., identifying any missing adhesive objects that should be present, any adhesive objects having areas outside of specified area ranges, and any objects that do not belong in an inspection site. Information on the comparison can simply be stored (i.e., identifying the board for appropriate later action) or can be used to activate alarm 38, provide a message on monitor 42, or activate board diverter 40 to take the board out of the production line to avoid further processing.

The processed and viewed board 14 is then removed by tractor mechanism 18, and the next board 14 is moved into position.

The information of the compliance of the viewed adhesive deposits with established conditions (e.g., area or height values) can be used for making adjustments to process conditions by the user. Adjustments to process conditions can also be made automatically by controller 30. Thus, in response to the information as to actual viewed printing, controller 30 can adjust squeegee velocity, squeegee pressure, snap-off, or downstop so as to improve the compliance of the viewed adhesive deposits with established conditions.

The use of camera 20 and vision processor 36 to view adhesive and verify deposits provides reliability and permits one to improve adhesive deposition accuracy by making appropriate adjustments. This provides cost and reliability benefits to the adhesive printing process, which already has significant advantages in terms of cost, speed, and ability to use a variety of adhesives (e.g., thicker adhesives that can initially hold components better in fast movements in downline processing). The high speed permitted by screen or stencil printing permits adhesive to be applied to the boards at high rates, to keep up with the high rates of utilization by subsequent manufacturing processes, and permits dual use of printing equipment for both solder and adhesive.

Other embodiments of the invention are within the scope of the claims. E.g., other parameters besides center of mass coordinates, area and height could be determined for viewed adhesive objects and used in verifying boards and in process control. Also, inspection sites could be defined over more than one field of view of the camera, and all adhesive deposits could be verified if desired.

What is claimed is:

1. An image processing method for determining the position of applied adhesive in at least one desired position on a substrate using a programmed controller comprising:

specifying at least one inspection site on a substrate for monitoring adhesive deposition using a programmed controller, applying adhesive to the substrate with an adhesive application device at the at least one inspection site, viewing the at least one inspection site at which adhesive has been applied with a camera that generates image signals, and sending the signals to the programmed controller, and processing the image signals using the programmed controller to determine if adhesive has been applied at the at least one inspection site at a position determined by the programmed controller.

2. The method of claim 1 wherein said specifying step includes using said camera to view a substrate on which adhesive has been applied in the desired pattern.

3. The method of claim 2 wherein said specifying step includes displaying on an image screen an image of at least a portion of said substrate carrying adhesive and receiving input from a user to define said at least one inspection site through an input device in operative association with the programmed controller.

4. The method of claim 3 wherein said specifying step includes identifying adhesive objects within each at least one inspection site.

5. The method of claim 4 wherein each said adhesive object is identified by a coordinate position and its areas further comprising the step of storing the coordinate position using the programmed controller.

6. The method of claim 5 wherein said processing step includes identifying viewed adhesive objects and comparing the identified objects with those identified during said determining step.

7. The method of claim 6 wherein said processing step includes determining the areas for said viewed adhesive objects, and said comparing step includes comparing the areas of said viewed objects with the areas of said objects identified during said determining.

8. The method of claim 4 wherein said processing step includes identifying viewed adhesive objects and comparing the identified objects with those identified during said specifying step.

9. The method of claim 8 wherein said comparing step includes determining if all objects identified during said determining are present in said viewed adhesive objects.

10. The method of claim 8 wherein said comparing step includes determining if said viewed adhesive objects include any objects that were not identified during said determining.

11. The method of claim 1 further comprising activating an alarm in response to said processing step.

12. The method of claim 1 further comprising diverting a substrate from further manufacture in response to said processing step if the programmed controller determines the adhesive has not been at the determined position.

13. The method of claim 1 wherein said applying adhesive step has associated process control parameters that affect the application of adhesive, and further comprising adjusting said process control parameters in response to said processing step.

14. The method of claim 13 wherein the adhesive is applied to the substrate using a stencil and squeegee and wherein said process control parameters include one or more of the follow: squeegee velocity, squeegee pressure, snap-off, and downstop.

15. The method of claim 1, wherein the adhesive is applied to the substrate using a stencil and squeegee and wherein adhesive is deposited on the substrate by the squeegee through selected openings in the stencil.

16. The method of claim 1, including the further step of applying adhesive to further substrates if the processing step determining the adhesive has been applied at the determined position.

17. Apparatus for applying adhesive to a substrate comprising a substrate support for supporting a substrate at a predetermined position, an adhesive applicator for printing adhesive in at least one desired position on said substrate, a source for supplying adhesive to said adhesive applicator, a camera for viewing adhesive deposited on said substrate by said applicator and to generate image signals identifying the presence of adhesive on at least one inspection site on said substrate, and a controller that selects and stores the at least one inspection site and receives said generated image signals from the camera and processes the image signals to determine if adhesive has been properly applied on said at least one inspection site.

18. The apparatus of claim 17 wherein said apparatus includes a monitor and a user input device connected to said controller, and said controller is operable to display an image of at least a portion of a substrate carrying adhesive applied in the desired pattern and to receive input from a user via said user input device to define said at least one selected inspection site, said controller being operable to identify objects within said at least one inspection site.

19. The apparatus of claim 18 wherein said controller determines if all objects identified in a said inspection site on said initial substrate are present in adhesive objects viewed by said camera.

20. The apparatus of claim 18 wherein said controller determines if adhesive objects viewed by said camera include any objects that were not identified in a said inspection site on said substrate.

21. The apparatus of claim 18 further comprising a vision processor connected between said camera and said controller that receives image signals from said camera and provides modified image signals to said controller.

22. The apparatus of claim 21 wherein said modified image signals include signals identifying each adhesive object by a coordinate position and its area.

23. The apparatus of claim 17 wherein said controller is operable to adjust process control parameters of said adhesive applicator in response to processing of image signals.

24. The apparatus of claim 23 wherein the adhesive application comprises a stencil and squeegee and wherein adhesive is deposited on the substrate by the squeeze through selected openings in the stencil and wherein said process control parameters include one or more of the following: squeegee velocity, squeegee pressure, snap-off, and downstop.

25. The apparatus of claim 17 further comprising an alarm that is connected to said controller and is activated by said controller in response to processing of image signals.

26. The apparatus of claim 17, wherein the adhesive applicator comprises a stencil and squeegee and wherein adhesive is deposited on the substrate by the squeegee through selected openings in the stencil.

27. The apparatus of claim 17 further comprising a substrate diverter that diverts a said board from further manufacture in response to processing of image signals.

* * * * *